(12) United States Patent
Mizuta et al.

(10) Patent No.: US 10,639,889 B2
(45) Date of Patent: May 5, 2020

(54) MEMS DEVICE, LIQUID EJECTING HEAD, LIQUID EJECTING APPARATUS, AND MANUFACTURING METHOD OF MEMS DEVICE

(71) Applicant: SEIKO EPSON CORPORATION, Tokyo (JP)

(72) Inventors: Shohei Mizuta, Matsumoto (JP); Eiju Hirai, Azumino (JP); Daisuke Yamada, Hachioji (JP); Yoichi Naganuma, Matsumoto (JP); Motoki Takabe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/191,282

(22) Filed: Nov. 14, 2018

(65) Prior Publication Data

US 2019/0143691 A1 May 16, 2019

(30) Foreign Application Priority Data

Nov. 16, 2017 (JP) ................................ 2017-220658
Apr. 17, 2018 (JP) ................................ 2018-078916

(51) Int. Cl.
*B41J 2/14* (2006.01)
*H01L 41/29* (2013.01)
(Continued)

(52) U.S. Cl.
CPC ....... *B41J 2/14201* (2013.01); *B41J 2/14233* (2013.01); *B41J 2/1623* (2013.01);
(Continued)

(58) Field of Classification Search
CPC ......................... B41J 2/14201; B41J 2/14233; B41J 2202/18; B41J 2002/14491; H01L 41/0973; H01L 41/29; H01L 41/0475
See application file for complete search history.

(56) References Cited

U.S. PATENT DOCUMENTS 10,328,698 B2 *   6/2019   Mizuno ................ B41J 2/14233
2009/0114441 A1   5/2009   Hashimoto
(Continued)

FOREIGN PATENT DOCUMENTS

JP     2009-117544 A    5/2009
JP     2010-87321 A     4/2010
(Continued)

*Primary Examiner* — Geoffrey S Mruk
(74) *Attorney, Agent, or Firm* — Workman Nydegger

(57) ABSTRACT

A MEMS device which includes an adhesive which adheres a first substrate and a second substrate to each other, in which a first space which includes an electrode, an individual electrode, a common electrode, a bump electrode, and a piezoelectric element and which is configured as a closed space which is isolated from an atmosphere by the first substrate, the second substrate, and the adhesive is disposed in a space between the first substrate and the second substrate, and in which a second space which does not include any of the electrode, the individual electrode, the common electrode, the bump electrode, or the piezoelectric element and which communicates with the atmosphere due to a through-hole which penetrates at least one of the first substrate and the second substrate is disposed in the space between the first substrate and the second substrate.

7 Claims, 9 Drawing Sheets

(51) Int. Cl.
*B41J 2/16* (2006.01)
*H01L 41/09* (2006.01)
*H01L 41/047* (2006.01)

(52) U.S. Cl.
CPC ...... *H01L 41/0475* (2013.01); *H01L 41/0973* (2013.01); *H01L 41/29* (2013.01); *B41J 2002/14491* (2013.01); *B41J 2202/18* (2013.01)

(56) References Cited

U.S. PATENT DOCUMENTS

| | | |
|---|---|---|
| 2011/0062534 A1 | 3/2011 | Hashimoto |
| 2012/0086088 A1 | 4/2012 | Hashimoto |
| 2015/0343777 A1 | 12/2015 | Seki et al. |
| 2016/0263889 A1* | 9/2016 | Hamaguchi .......... B41J 2/14201 |
| 2017/0066239 A1 | 3/2017 | Hirai et al. |
| 2017/0368828 A1* | 12/2017 | Naganuma ........... B41J 2/14233 |

FOREIGN PATENT DOCUMENTS

| | | |
|---|---|---|
| JP | 2014-51008 A | 3/2014 |
| JP | 2015-223831 A | 12/2015 |
| JP | 2017-45746 A | 3/2017 |
| JP | 2017-52134 A | 3/2017 |

* cited by examiner

MEMS DEVICE, LIQUID EJECTING HEAD, LIQUID EJECTING APPARATUS, AND MANUFACTURING METHOD OF MEMS DEVICE

The entire disclosure of Japanese Patent Application No. 2017-220658, filed Nov. 16, 2017 and 2018-078916, filed Apr. 17, 2018 are expressly incorporated by reference herein.

BACKGROUND

1. Technical Field

The present invention relates to a MEMS device, a liquid ejecting head which is an example of a MEMS device, a liquid ejecting apparatus which is provided with the liquid ejecting head, and a manufacturing method of a MEMS device.

2. Related Art

An ink jet recording head which is an example of a micro electro mechanical systems (MEMS) device includes a flow path forming substrate in which a pressure generating chamber which stores a liquid is formed, and a functional element (a piezoelectric element) which is provided on one surface side of the flow path forming substrate. The ink jet recording head generates a pressure change in the liquid inside the pressure generating chamber by driving the functional element (the piezoelectric element) and ejects a droplet from a nozzle which communicates with the pressure generating chamber.

A thin film shaped piezoelectric element which is formed by film formation on a flow path forming substrate and the photolithography method is proposed as a piezoelectric element to be used in the ink jet recording head. By using the thin film shaped piezoelectric element, although it is possible to dispose the piezoelectric elements at a high density, it is difficult to electrically connect the piezoelectric elements which are disposed at high density and the drive circuits to each other.

For example, the ink jet recording head described in JP-A-2014-51008 includes a flow path forming substrate which is provided with pressure generating chambers and piezoelectric elements, and a drive circuit substrate which is provided with drive circuits which drive the piezoelectric elements, in which the drive circuits and the piezoelectric elements are electrically connected to each other via pumps which are provided on the drive circuit substrate. A plurality of the pumps are disposed in a peripheral region of the piezoelectric elements and the space between the plurality of pumps are filled with a sealing material (an adhesive).

By using solder bumps in the connections between the drive circuits and the piezoelectric elements, it is possible to easily electrically connect the piezoelectric elements which are disposed at high density and the drive circuits to each other. The adhesive is disposed between the flow path forming substrate and the drive circuit substrate and isolates the piezoelectric elements from the atmosphere and protects against moisture. However, when the adhesive is raised to a high temperature in order to cure the adhesive, a gas inside the spaces (hereinafter, the sealed spaces) in which the piezoelectric elements are sealed may expand and the drive circuits and the piezoelectric elements may become deviated from each other before the adhesive is cured.

Therefore, in order to prevent an increase in the pressure inside the sealed spaces, through-holes for opening the sealed spaces to the atmosphere may be provided in the drive circuit substrate.

However, due to the atmosphere-open through-holes of the drive circuit substrate, liquid or gas may enter and the protection of the drive circuits and the piezoelectric elements (the functional elements) from moisture may be insufficient.

A similar problem also exists for MEMS devices other than the ink jet recording head, for example, a surface acoustic wave (SAW) oscillator. An SAW oscillator described in JP-A-2009-117544 is an example of a MEMS device, is provided with a semiconductor substrate on which SAW elements (surface acoustic wave elements (functional elements)) and solder bumps are provided, and a sealing substrate. High-density mounting is realized using the solder bumps, and surface oxidation and the bonding of water molecules on the SAW elements (the functional elements) is suppressed by a sealing member (an adhesive) which bonds the semiconductor substrate and the sealing substrate to each other. For example, it is possible to bond the two substrates using an adhesive, stably supply a drivable signal to the functional elements, and suppress degradation of the functional elements. When the SAW oscillator has atmosphere-open through-holes, the suppression of surface oxidation the bonding of water molecules with the SAW elements (the functional elements) may not be sufficient.

SUMMARY

The invention can be realized in the following aspects or application examples.

According to this application example, there is provided a MEMS device including a first substrate which includes a first electrode, a second substrate which includes a second electrode and on which the first electrode and the second electrode are disposed by being laminated between the second substrate and the first substrate, a third electrode which is disposed between the first substrate and the second substrate and which electrically connects the first electrode and the second electrode to each other, a piezoelectric element which is disposed between the first substrate and the second substrate, and an adhesive which adheres the first substrate and the second substrate to each other, in which a first space which includes the first electrode, the second electrode, the third electrode, and the piezoelectric element and which is configured as a closed space which is isolated from an atmosphere by the first substrate, the second substrate, and the adhesive is disposed in a space between the first substrate and the second substrate, and in which a second space which does not include any of the first electrode, the second electrode, the third electrode, or the piezoelectric element and which communicates with the atmosphere due to a through-hole which penetrates at least one of the first substrate and the second substrate is disposed in the space between the first substrate and the second substrate.

According to this application example, there is provided a liquid ejecting head including the MEMS device according to the application example.

According to this application example, there is provided a liquid ejecting apparatus including the liquid ejecting head according to the application example.

According to this application example, there is provided a manufacturing method of a MEMS device which includes a first substrate which includes a first electrode, a second substrate which includes a second electrode and on which the first electrode and the second electrode are disposed by being laminated between the second substrate and the first substrate, a third electrode which is disposed between the first substrate and the second substrate and which electrically connects the first electrode and the second electrode to each other, a piezoelectric element which is disposed between the first substrate and the second substrate, and an adhesive which adheres the first substrate and the second substrate to each other, the method including configuring a first space which includes the first electrode, the second electrode, the third electrode, and the piezoelectric element in a space between the first substrate and the second substrate as a closed space which is isolated from an atmosphere by the first substrate, the second substrate, and the adhesive, forming a through-hole which penetrates at least one of the first substrate and the second substrate in a second space which does not include any of the first electrode, the second electrode, the third electrode, or the piezoelectric element in the space between the first substrate and the second substrate and causing the second space to communicate with the atmosphere, and heat-curing the adhesive.

BRIEF DESCRIPTION OF THE DRAWINGS

The invention will be described with reference to the accompanying drawings, wherein like numbers reference like elements.

FIG. 4 is a schematic plan view illustrating the configuration of the liquid ejecting head (the recording head) according to the first embodiment with a first substrate rendered see-through.

DESCRIPTION OF EXEMPLARY EMBODIMENTS

Figure 1:
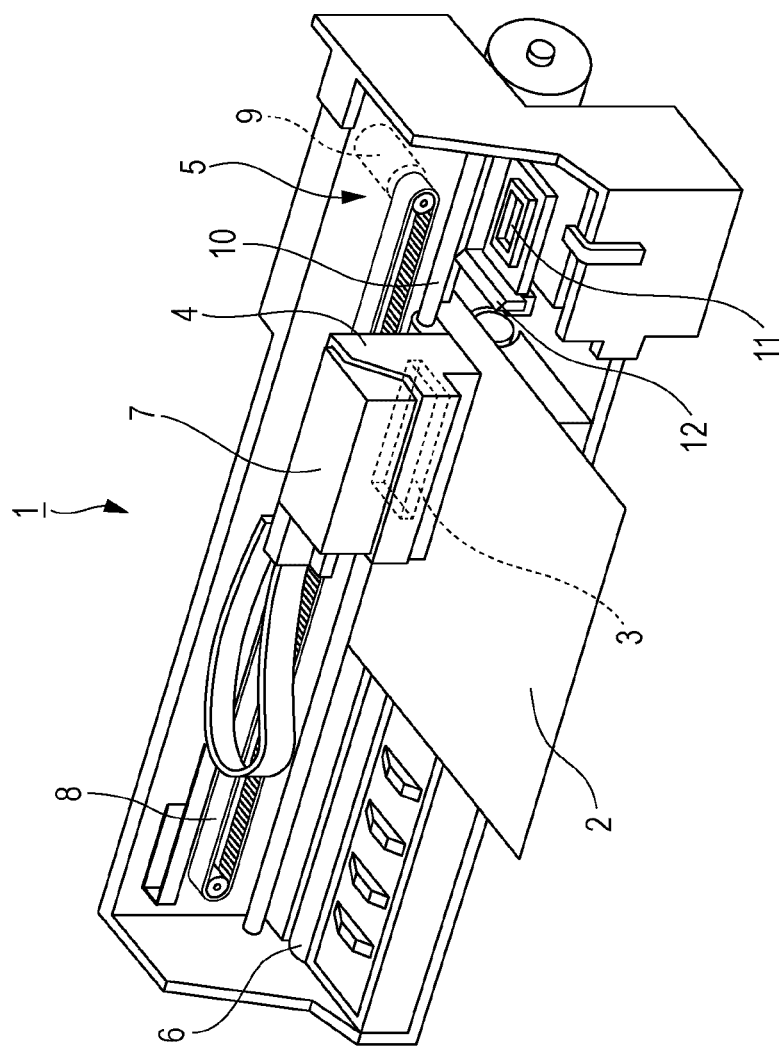
FIG. 1 is a schematic diagram illustrating the configuration of a liquid ejecting apparatus (a printer) according to a first embodiment.

Hereinafter, the embodiments of the invention will be described with reference to the drawings. The embodiments illustrate modes of the invention, are not intended to limit the invention, and may be arbitrarily modified within a scope of the technical idea of the invention. In the drawings used in the following description, the scale of each layer and each part is depicted differently from actuality to render each layer and each part a visually recognizable size.

First Embodiment

Outline of Printer

FIG. 1 is a schematic diagram illustrating the configuration of a liquid ejecting apparatus (hereinafter referred to as a printer) according to the first embodiment. First, a description will be given of an outline of a printer 1 which is an example of "a liquid ejecting apparatus" with reference to FIG. 1.

The printer 1 according to the present embodiment is an ink jet recording apparatus which ejects an ink which is an example of "a liquid" onto a recording medium 2 such as recording paper and performs recording (printing) of an image or the like on the recording medium 2.

As illustrated in FIG. 1, the printer 1 is provided with a recording head 3, a carriage 4 to which the recording head 3 is attached, a carriage movement mechanism 5 which moves the carriage 4 in a main scanning direction, a transport mechanism 6 which moves the recording medium 2 in a sub-scanning direction, and the like. Here, the ink is stored in an ink cartridge 7 which serves as a liquid supply source. The ink cartridge 7 is installed on the recording head 3 in a detachable manner.

The recording head 3 is a "micro electro mechanical systems (MEMS) device" and configures an example of "a liquid ejecting head". A configuration may be adopted in which the ink cartridge is disposed on the main body side of the printer and the ink is supplied to the recording head 3 from the ink cartridge through an ink supply tube.

The carriage movement mechanism 5 is provided with a timing belt 8 and is driven by a pulse motor 9 such as a DC motor. When the pulse motor 9 actuates, the carriage 4 is guided by a guide rod 10 which bridges the printer 1 and moves reciprocally in the main scanning direction (the width direction of the recording medium 2). The position of the carriage 4 in the main scanning direction is detected by a linear encoder (not illustrated) which is a type of position information detection unit. The linear encoder transmits the detection signal, that is, an encoder pulse to the control unit of the printer 1.

A home position which serves as a reference point of the scanning of the carriage 4 is set to an end portion region which is closer to the outside than a recording region in the movement range of the carriage 4. A cap 11 which seals nozzles 22 (refer to FIG. 2) which are formed in a nozzle surface (a nozzle plate 21 (refer to FIG. 2)) of the recording head 3 and a wiping unit 12 for wiping the nozzle surface are provided at the home position in order from the end portion side.

Outline of Recording Head

Figure 2:
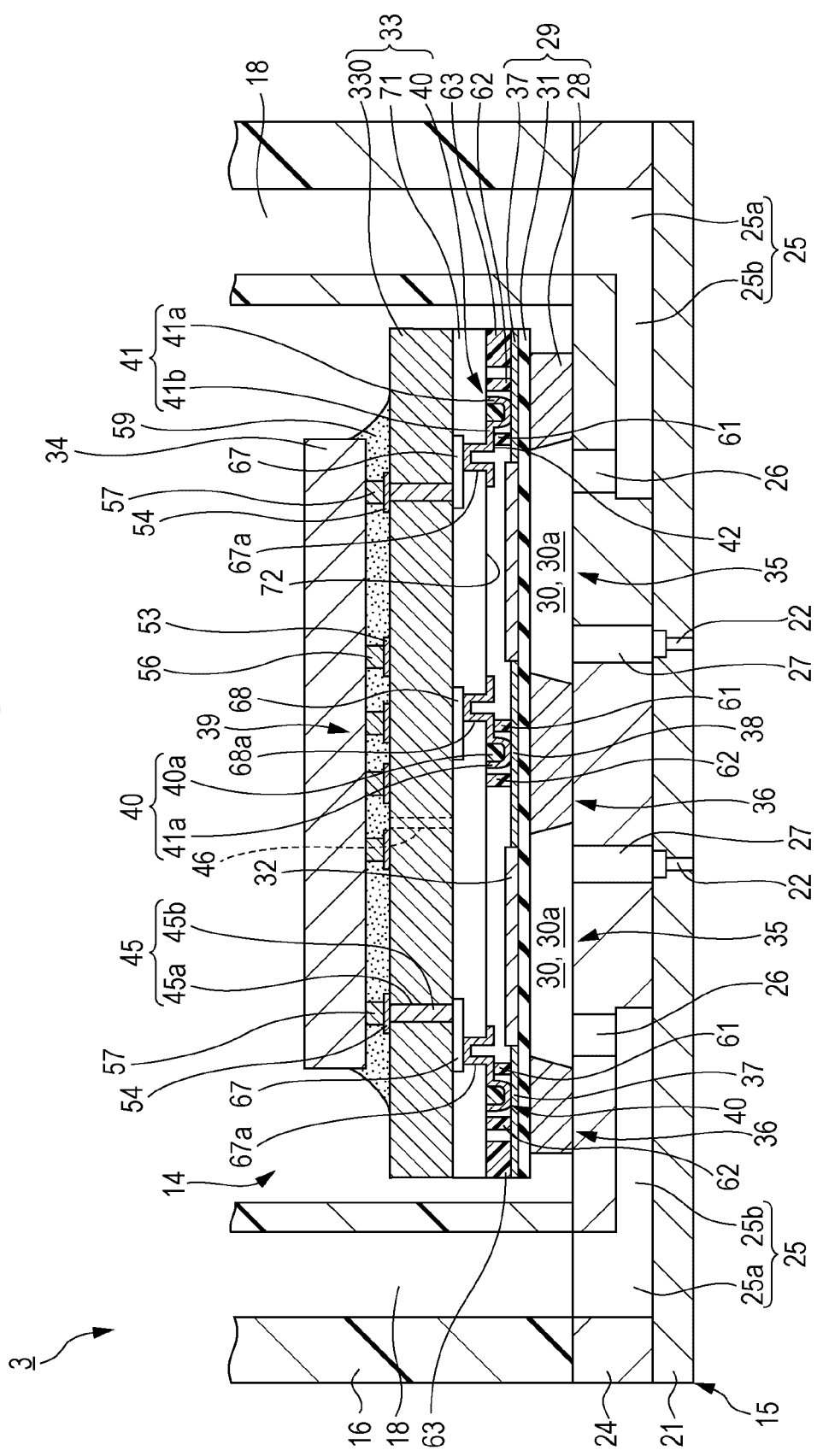
FIG. 2 is a schematic sectional diagram illustrating the configuration of a liquid ejecting head (a recording head) according to the first embodiment.

FIG. 2 is a schematic sectional diagram illustrating the configuration of a liquid ejecting head (the recording head 3) according to the present embodiment.

Next, a description will be given of an outline of the recording head 3 with reference to FIG. 2.

As illustrated in FIG. 2, the recording head 3 includes a flow path unit 15, an electronic device 14, and a head case 16. In the recording head 3, the flow path unit 15 and the electronic device 14 are attached to the head case 16 in a state of being laminated Hereinafter, a description will be given in which the direction in which the flow path unit 15 and the electronic device 14 are laminated is a vertical direction.

The head case 16 is a box-shaped member which is formed of a synthetic resin and reservoirs 18 which supply the ink to each pressure generating chamber 30 are formed in an inner portion of the head case 16. The reservoir 18 is a space which is common to the plurality of pressure generating chambers 30 which are provided to line up and in which the ink is stored. Two of the reservoirs 18 are formed corresponding to the rows of the pressure generating chambers 30 which are provided to line up in two rows. An ink introduction path (not illustrated) which introduces the ink from the ink cartridge 7 side to the reservoir 18 is formed above the head case 16.

The flow path unit 15 which is bonded to the bottom surface of the head case 16 includes a communicating substrate 24 and the nozzle plate 21. The communicating substrate 24 is a plate material formed of silicon and, in the present embodiment, is produced from a silicon single crystal substrate having a surface (the top surface and the bottom surface) crystal orientation of a (110) plane. Common liquid chambers 25 and individual communicating paths 26 are formed in the communicating substrate 24 using etching. The common liquid chambers 25 communicate with the reservoirs 18, are common to the pressure generating chambers 30, and store the ink, and the individual communicating paths 26 individually supply the ink from the reservoirs 18 to each of the pressure generating chambers 30 via the common liquid chambers 25. The common liquid chambers 25 are vacant portions which are long along the nozzle row direction and two rows are formed corresponding to the rows of the pressure generating chambers 30 which are provided to line up in two rows. The common liquid chamber 25 is formed of a first liquid chamber 25a which penetrates the communicating substrate 24 in the plate thickness direction and a second liquid chamber 25b which is depressed from the bottom surface side toward the top surface side of the communicating substrate 24 to the middle of the communicating substrate 24 in the plate thickness direction and which is formed in a state in which a thin plate portion remains on the top surface side. A plurality of the individual communicating paths 26 are formed in the thin plate portion of the second liquid chamber 25b along the direction in which the pressure generating chambers 30 are provided to line up corresponding to the pressure generating chambers 30. The individual communicating paths 26 communicate with one end portion of the corresponding pressure generating chambers 30 in the longitudinal direction in a state in which the communicating substrate 24 and a second substrate 29 (described later) are bonded.

Nozzle communicating paths 27 which penetrate the communicating substrate 24 in the plate thickness direction are formed at positions corresponding to each of the nozzles 22 of the communicating substrate 24. In other words, a plurality of the nozzle communicating paths 27 are formed along the nozzle row direction corresponding to the nozzle rows. The pressure generating chambers 30 and the nozzles 22 communicate due to the nozzle communicating paths 27. The nozzle communicating paths 27 communicate with the other end portion (the end portion on the opposite side from the individual communicating path 26 side) in the longitudinal direction of the corresponding pressure generating chambers 30 in a state in which the communicating substrate 24 and the second substrate 29 are bonded to each other.

The nozzle plate 21 is a substrate formed of silicon (for example, a silicon single crystal substrate) which is bonded to the bottom surface of the communicating substrate 24 (the surface on the opposite side from the second substrate 29 side). In the present embodiment, openings on the bottom surface side of the spaces which form the common liquid chambers 25 are sealed by the nozzle plate 21. The plurality of nozzles 22 are provided in a linear shape (row shape) in the nozzle plate 21. In the present embodiment, two of the nozzle rows are formed corresponding to the two rows of the pressure generating chambers 30 which are formed. The plurality of nozzles 22 which are provided to line up (the nozzle row) is provided at a pitch (for example, 600 dpi) corresponding to the dot forming density from the nozzle 22 of one end side to the nozzle 22 of the other end side such that the nozzles 22 are provided at an equal interval along the sub-scanning direction which obliquely intersects the main scanning direction.

The electronic device 14 is a thin plate-shaped piezoelectric device which functions as an actuator which generates a pressure change in the ink inside each of the pressure generating chambers 30. In other words, in the electronic device 14, a pressure change is generated in the ink inside each of the pressure generating chambers 30 and the ink is ejected from the nozzles 22 which communicate with each of the pressure generating chambers 30. The electronic device 14 has a configuration in which the second substrate 29, adhesives 61, 62, and 63, a first substrate 33, and a drive IC 34 are laminated in order to form a unit. In other words, in the electronic device 14, the second substrate 29, and the first substrate 33 which includes the drive IC 34 are bonded together by the adhesives 61, 62, and 63.

The second substrate 29 is disposed to be laminated on the first substrate 33 and includes a pressure generating chamber forming substrate 28, vibration plates 31, individual electrodes 37, a common electrode 38, and piezoelectric elements 32.

The pressure generating chamber forming substrate 28 is a hard plate material formed of silicon and is produced from a silicon single crystal substrate having a surface (the top surface and the bottom surface) crystal orientation of a (110) plane. The pressure generating chamber forming substrate 28 includes penetrating ports 30a which form the pressure generating chambers 30. The penetrating ports 30a are formed by subjecting the silicon single crystal substrate having a (110) orientation to anisotropic etching in the plate thickness direction. The penetrating ports 30a are spaces (vacant portions) which form the pressure generating chambers 30.

The vibration plates 31 are thin film-shaped members which have elasticity and are formed on the top surface (the surface on the opposite side from the communicating substrate 24 side) of the pressure generating chamber forming substrate 28. The vibration plates 31 are configured by an elastic film, which is formed of a silicon oxide which is formed on the top surface of the pressure generating chamber forming substrate 28, and an insulating film which is formed of a zirconium oxide which is formed on the elastic film. The vibration plates 31 seal the openings on the top side of the penetrating ports 30a of the pressure generating chamber forming substrate 28.

The openings on the bottom side of the penetrating ports 30a of the pressure generating chamber forming substrate 28 are sealed by the communicating substrate 24. The penetrating ports 30a (the vacant portions) which are sealed by the vibration plates 31 and the communicating substrate 24 form the pressure generating chambers 30. The pressure generating chambers 30 are formed in two rows corresponding to the two nozzle rows which are formed. The pressure generating chambers 30 are vacant portions (spaces) which are long in the direction orthogonally intersecting the nozzle row direction. For each of the pressure generating chambers 30, one end portion of the pressure generating chamber 30 in the longitudinal direction communicates with the individual communicating path 26 and the other end portion communicates with the nozzle communicating path 27.

A region corresponding to the pressure generating chamber 30 in the vibration plate 31 (a region in which the vibration plate 31 and the pressure generating chamber forming substrate 28 are not in contact with each other) functions as a displacement portion at which the vibration plate 31 is displaced in a direction which distances from or approaches the nozzle 22 in accordance with the displacement of the piezoelectric element 32. In other words, the region of the vibration plate 31 corresponding to the pressure generating chamber 30 (the region in which the vibration plate 31 and the pressure generating chamber forming substrate 28 are not in contact with each other) is a drive region 35 in which the displacement of the vibration plate 31 is permitted. Meanwhile, the region of the vibration plate 31 which is deviated from the pressure generating chamber 30 (the region in which the vibration plate 31 and the pressure generating chamber forming substrate 28 are in contact with each other) is a non-drive region 36 in which the displacement of the vibration plate 31 is inhibited.

In the drive region 35, the piezoelectric element 32 is formed on a surface on the opposite side of the vibration plate 31 from the pressure generating chamber forming substrate 28 side. In detail, a bottom electrode layer (the individual electrode), a piezoelectric body layer, and a top electrode layer (the common electrode) are laminated in order to form the piezoelectric element 32 on the surface on the opposite side of the vibration plate 31 from the pressure generating chamber forming substrate 28 side in the drive region 35. The piezoelectric element 32 is a so-called flexural mode piezoelectric element and causes the vibration plate 31 to warp in a flexural manner. When a magnetic field corresponding to the potential difference between the bottom electrode layer and the top electrode layer is applied to the piezoelectric body layer, the piezoelectric element 32 is displaced in a direction which distances from or approaches the nozzle 22.

The bottom electrode layer which configures the piezoelectric element 32 is provided to extend to the non-drive region 36 which is closer to the outside than the piezoelectric element 32, forms the individual electrode 37, and is electrically connected to a corresponding bump electrode 40 (described later). In the bottom electrode layer of the piezoelectric element 32 which is provided to extend to the non-drive region 36, the portion which is in contact with the bump electrode 40 forms the individual electrode 37 and the space between the portion which configures the piezoelectric element 32 and the portion which forms the individual electrode 37 forms the individual wiring.

The individual electrode 37 is an example of "a second electrode" and the bump electrode 40 is an example of "a third electrode".

The top electrode layer which configures the piezoelectric element 32 is provided to extend to the non-drive region 36 between the rows of the piezoelectric elements 32, forms the common electrode 38, and is electrically connected to the corresponding bump electrode 40 (described later). In the top electrode layer of the piezoelectric element 32 which is provided to extend to the non-drive region 36, the portion which is in contact with the bump electrode 40 forms the common electrode 38 and the space between the portion which configures the piezoelectric element 32 and the portion which forms the common electrode 38 forms the common wiring.

The common electrode 38 is an example of "a second electrode".

In the longitudinal direction of the piezoelectric element 32, the individual electrode 37 is formed closer to the outside than the piezoelectric element 32 and the common electrode 38 is formed on the inside. In the present embodiment, the common electrode 38 which is provided to extend from the row of piezoelectric elements 32 of one side and the common electrode 38 which is provided to extend from the row of piezoelectric elements 32 of the other side are electrically connected to each other by the common wiring.

The first substrate 33 is a relay substrate (a wiring substrate) which is disposed between the second substrate 29 and the drive IC 34 and which supplies a signal of the drive IC 34 to the second substrate 29. The first substrate 33 includes a base material 330 which is formed of a silicon single crystal substrate, and wirings, electrodes, and the like which are formed on the base material 330.

Electrodes 67 which are electrically connected to the individual electrodes 37 of the second substrate 29 and electrodes 68 which are electrically connected to the common electrode 38 of the second substrate 29 are formed on the bottom surface (the surface on the second substrate 29 side) of the base material 330. A plurality of the electrodes 67 are formed along the nozzle row direction corresponding to the piezoelectric elements 32.

The electrodes 67 and 68 are examples of "a first electrode".

The electrodes 67 and 68 are covered by a protective layer 71. The protective layer 71 is configured by a silicon oxide, for example, and includes openings 67a which expose portions of the electrodes 67 and opening 68a which expose portions of electrodes 68. A surface 72 of the protective layer 71 on the opposite side from the side which covers the electrodes 67 and 68 is subjected to a planarization process and are rendered flat.

The bump electrodes 40 are formed on the surface 72 of the protective layer 71 (the surface 72 of the protective layer 71 on the opposite side from the side of the electrodes 67 and 68). The bump electrodes 40 are disposed at positions corresponding to each of the individual electrodes 37 and the common electrode 38 of the second substrate 29. The bump electrodes 40 are configured by an elastic internal resin 40a and a conductive film 41 which covers the internal resin 40a. It is possible to use a resin such as a polyimide resin, for example, as the internal resin 40a. For the conductive film 41, it is possible to use metal alone, an alloy, a metal silicide, a metal nitride, a laminated film of these materials, or the like. The conductive film 41 includes a portion 41a (hereinafter referred to as the conductive film 41a) which covers the internal resin 40a, and a portion 41b (hereinafter referred to as the conductive film 41b) which covers the surface 72 and the openings 67a and 68a of the protective layer 71.

In other words, the bump electrodes 40 are configured by the internal resin 40a and the conductive film 41a. The conductive film 41b forms the wirings which electrically connect the bump electrodes 40 and the electrodes 67 and 68 to each other. Since the conductive film 41b is formed to cover the flat surface 72 of the protective layer 71, the conductive film 41b has a flat surface 42 which reflects the shape of the flat surface 72 of the protective layer 71.

The bump electrode 40 has elasticity and is electrically connected to the individual electrodes 37 and the common electrode 38 of the second substrate 29 in a state of being elastically warped (a pressed state). Due to the bump electrodes 40 having elasticity, in comparison to a case in which the bump electrodes 40 do not have elasticity, the bump electrodes 40 and the individual electrodes 37 are favorably electrically connected to each other and the bump electrodes 40 and the common electrode 38 are favorably electrically connected to each other. Therefore, the electrodes 67 of the first substrate 33 are favorably electrically connected to the individual electrodes 37 of the second substrate 29 via the bump electrodes 40. The electrodes 68 of the first substrate 33 are favorably electrically connected to the common electrode 38 of the second substrate 29 via the bump electrodes 40.

A plurality of (in the present embodiment, four) power wirings 53 which supplies power (for example, VDD1 (power source of low voltage circuits), VDD2 (power source of high voltage circuits), VSS1 (power source of low voltage circuits), and VSS2 (power source of high voltage circuits)) to the drive IC 34 are formed at the center of the top surface (the surface on the drive IC 34 side) of the base material 330. Each of the power wirings 53 is provided to extend along the nozzle row direction, that is, the longitudinal direction of the drive IC 34 and is connected to an external power source (not illustrated) or the like via a wiring substrate (not illustrated) such as a flexible cable at the end portion in the longitudinal direction. A corresponding power bump electrode 56 of the drive IC 34 is electrically connected on the power wiring 53.

Individual connection terminals 54 are formed on an end of the top surface of the base material 330 (a region which is deviated to the outside from a region in which the power wirings 53 are formed). The individual connection terminals 54 are electrically connected to individual bump electrodes 57 of the drive IC 34 and receive input of the signals from the drive IC 34. A plurality of the individual connection terminals 54 are formed along the nozzle row direction corresponding to the piezoelectric elements 32. The individual connection terminals 54 are electrically connected to the electrodes 67 which are formed on the bottom surface of the base material 330 via penetrating wirings 45 which are formed in the inner portion of the base material 330.

The penetrating wirings 45 are wirings which relay between the bottom surface of the base material 330 and the top surface of the base material 330 and are configured by through-holes 45a which penetrate the base material 330 in the plate thickness direction and conducting portions 45b which fill the inner portions of the through-holes 45a. The conducting portions 45b are configured by, for example, a metal such as copper (Cu), tungsten (W), or nickel (Ni).

The drive IC 34 is an IC chip for driving the piezoelectric elements 32 and is disposed by being laminated on the top surface of the base material 330 (the top surface of the first substrate 33) via an adhesive 59 such as an anisotropic conducting film (ACF). A plurality of the individual bump electrodes 57 which are electrically connected to the power bump electrodes 56, which are electrically connected to the power wirings 53, and the individual connection terminals 54 are provided to line up along the nozzle row direction on the surface of the drive IC 34 on the first substrate 33 side.

Power (a voltage) from the power wirings 53 is supplied to the drive IC 34 via the power bump electrodes 56. The drive IC 34 generates signals (drive signals and common signals) for individually driving each of the piezoelectric elements 32. The drive signals which are generated by the drive IC 34 are supplied to the bottom electrode layer of the piezoelectric elements 32 via the individual bump electrodes 57, the individual connection terminals 54, the penetrating wirings 45, the electrodes 67, the bump electrodes 40, and the individual electrodes 37. The common signals which are generated by the drive IC 34 are supplied to the top electrode layer of the piezoelectric element 32 via the wirings (not illustrated) which are formed in the base material 330, the electrodes 68, the bump electrodes 40, and the common electrode 38.

The adhesives 61, 62, and 63 are disposed in the non-drive region 36 between the first substrate 33 and the second substrate 29. The adhesives 61, 62, and 63 are bonded between the first substrate 33 and the second substrate 29. In other words, the first substrate 33 and the second substrate 29 are bonded to each other by the adhesives 61, 62, and 63.

The adhesives 61, 62, and 63 are formed of a resin which has photo-sensitivity and heat curing properties, for example, a resin which uses an epoxy resin, an acrylic resin, a phenol resin, a polyimide resin, a silicon resin, a styrene resin, or the like as the main component. Although a detailed description will be given later, a resin solution having photo-sensitivity and heat curing properties (a photosensitive adhesive) is applied to the second substrate 29 and patterning is performed using the photolithography method to form adhesives 61a, 62a, and 63a which are temporarily cured on the surface of the second substrate 29 on the first substrate 33 side (refer to FIG. 9). The first substrate 33 is stuck to the second substrate 29, the main curing is performed in a state in which the adhesives 61a, 62a, and 63a which are temporarily cured abut the first substrate 33, and the adhesives 61, 62, and 63 are formed (refer to FIG. 10).

The adhesives 61 and 62 are disposed close to the bump electrodes 40 in a belt shape along the nozzle row direction in a state of being separated from the bump electrodes 40. As described above, the bump electrodes 40 are electrically connected to the individual electrodes 37 and the common electrode 38 in a state of being elastically warped. The adhesives 61 and 62 are separated from the bump electrodes 40 to the extent that the adhesives 61 and 62 do not interfere with the bump electrodes 40 even if the bump electrodes 40 are elastically warped.

Figure 3:
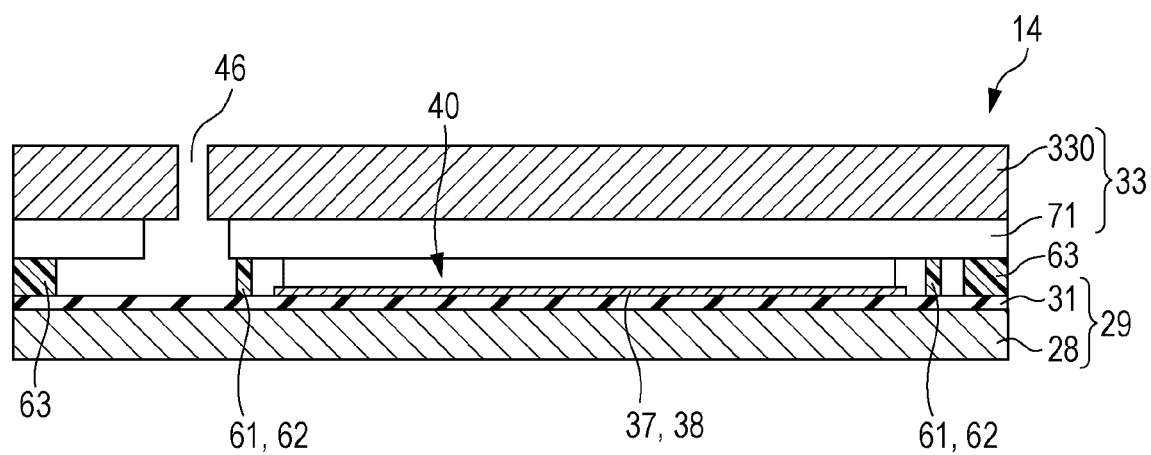
FIG. 3 is a schematic sectional diagram illustrating the configuration of an electronic device according to the first embodiment.
Figure 4:
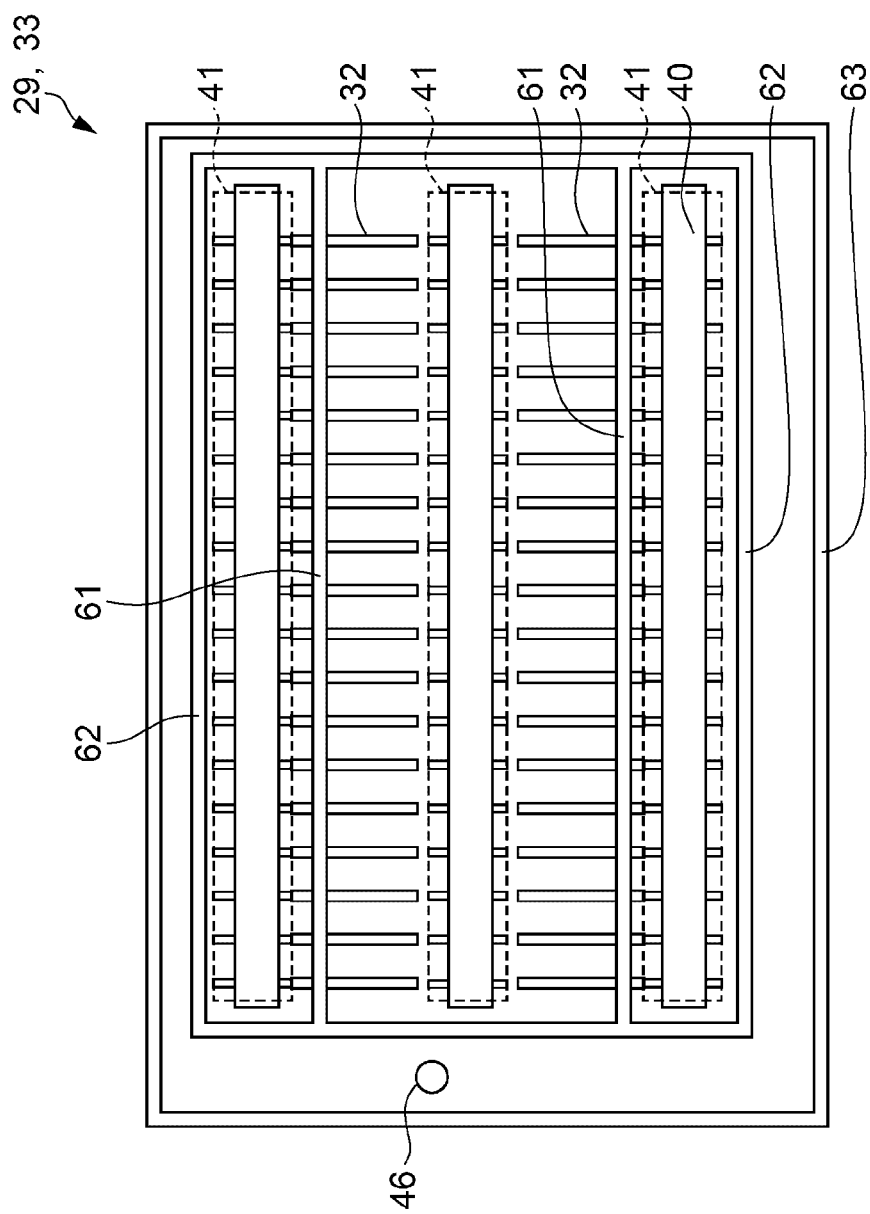

FIG. 4 is a schematic plan view illustrating the configuration of the liquid ejecting head (the recording head 3) according to the first embodiment with the first substrate 33 rendered see-through. The adhesive 63 is disposed to surround the drive region 35 and the non-drive region 36 (refer to FIG. 2) on the peripheral edge portion of the first substrate 33 and the second substrate 29 and has a frame shape. As illustrated in FIGS. 2 to 4, the adhesive 63 includes a through-hole 46 which penetrates at least one of the first substrate 33 and the second substrate 29 and which communicates with the atmosphere. The through-hole 46 is present inside a space (a second space (described later)) which does not include any of the individual electrodes 37, the common electrode 38, the electrodes 67 and 68, the bump electrodes 40, or the piezoelectric elements 32 and which is formed by the adhesive 63, the first substrate 33, and the second substrate 29. The individual electrodes 37, the common electrode 38, the electrodes 67 and 68, the bump electrodes 40, and the piezoelectric elements 32 are sealed by the first substrate 33, the second substrate 29, the adhesive 61, and the adhesive 62 (a first space (described later)) and the influence of external moisture (humidity) is suppressed. In other words, by forming the adhesive 61 and the adhesive 62 which surround the individual electrodes 37, the common electrode 38, the electrodes 67 and 68, the bump electrodes 40, and the piezoelectric elements 32 between the first substrate 33 and the second substrate 29 (the first space (described later)), the influence of moisture on the individual electrodes 37, the common electrode 38, the electrodes 67 and 68, the bump electrodes 40, and the piezoelectric elements 32 is suppressed and degradation of the individual electrodes 37, the common electrode 38, the electrodes 67 and 68, the bump electrodes 40, and the piezoelectric elements 32 caused by moisture is suppressed.

In the space between the first substrate 33 and the second substrate 29, a space which includes the electrodes 67 and 68 (the first electrode), the individual electrodes 37 and the common electrode 38 (the second electrode), the bump electrodes 40 (the third electrode), and the piezoelectric elements 32 and which is configured as a closed space which is isolated from the atmosphere by the first substrate 33, the second substrate 29, the adhesive 61, and the adhesive 62 is an example of "the first space". In other words, the first space is a space which is surrounded by the adhesives 61 and 62 as viewed from the vertical direction in plan view.

In the space between the first substrate 33 and the second substrate 29, other than the space (the first space) which includes the electrodes 67 and 68 (the first electrode), the individual electrodes 37 and the common electrode 38 (the second electrode), the bump electrodes 40 (the third electrode), and the piezoelectric elements 32 and which is configured as a closed space which is isolated from the atmosphere by the first substrate 33, the second substrate 29, the adhesive 61, and the adhesive 62, a space which does not include any of the electrodes 67 and 68 (the first electrode), the individual electrodes 37 and the common electrode 38 (the second electrode), the bump electrodes 40 (the third electrode), or the piezoelectric elements 32 and which is caused to communicate with the atmosphere by the through-hole 46 which penetrates at least one of the first substrate 33 and the second substrate 29 is an example of "a second space".

FIG. 3 is a schematic sectional diagram illustrating the configuration of an electronic device according to the first embodiment.

The through-hole 46 is formed in at least one of the first substrate 33 and the second substrate 29 and penetrates the base material 330 in the plate thickness direction (in the example of FIG. 3, is formed in the first substrate 33 (the base material 330)). The second space is opened to the atmosphere due to the presence of the through-hole 46 in the second space outside of the first space. In this manner (refer to FIG. 4), by disposing the first space separately from the second space, even if the gas inside the second space expands, since the through-hole 46 is present and the second space communicates with the atmosphere, it is possible to reduce the pressure rising and it is possible to reduce the force which resists the adhering force of the adhesives 61, 62, and 63 and to reduce the positional deviation between the first substrate 33 and the second substrate 29.

In this manner, in the recording head 3, the ink from the ink cartridge 7 is introduced to the pressure generating chambers 30 via the ink introduction paths, the reservoirs 18, the common liquid chambers 25, and the individual communicating paths 26. The second substrate 29 is provided with the piezoelectric elements 32 which are electrically connected to the individual electrodes 37 and the common electrode 38 (the second electrode) and which generate pressure changes in the ink inside the pressure generating chambers 30. In this state, the piezoelectric elements 32 are driven by supplying the drive signals from the drive IC 34 to the piezoelectric elements 32 of the second substrate 29 via the wirings and the electrodes which are formed on the first substrate 33, and the pressure changes are generated in the pressure generating chambers 30 through the driving of the piezoelectric elements 32. By using these pressure changes, ink droplets are ejected from the nozzles 22 via the nozzle communicating paths 27 in the recording head 3.

Manufacturing Method of Recording Head

Next, a description will be given of the manufacturing method of the liquid ejecting head (the recording head 3) according to the present embodiment.

Figure 5:
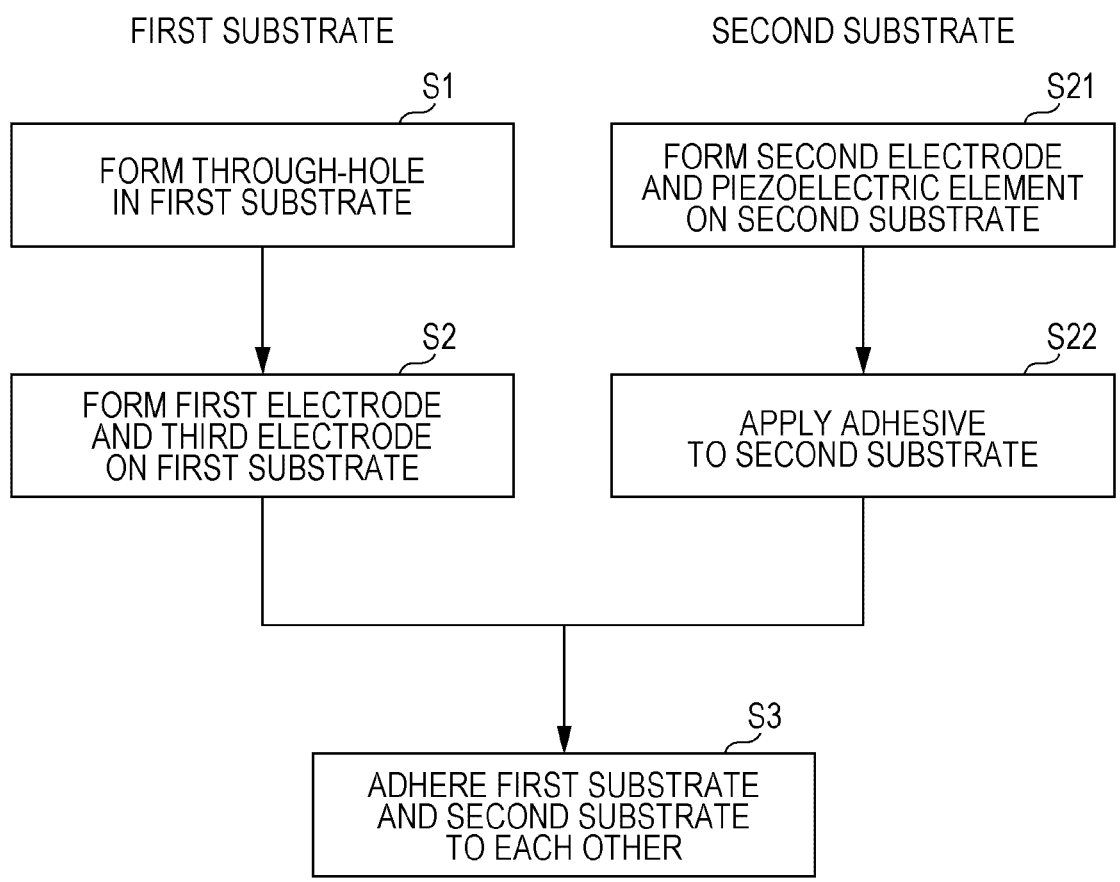
FIG. 5 is a process flow illustrating a manufacturing method of the liquid ejecting head (the recording head) according to the first embodiment.

FIG. 5 is a process flow illustrating the manufacturing method of the recording head 3.

As illustrated in FIG. 5, the manufacturing method of the recording head 3 includes a process of forming the through-hole 46 in the first substrate 33 (step S1), a process of forming the bump electrodes 40 and the electrodes 67 and 68 in the first substrate 33 (step S2), a process of forming the individual electrodes 37, the common electrode 38, and the piezoelectric elements 32 in the second substrate 29 (step S21), a process of forming the adhesives 61, 62, and 63 (step S22), and a process of curing the adhesives 61, 62, and 63 and bonding the first substrate 33 and the second substrate 29 to each other (step S3).

Figure 6:
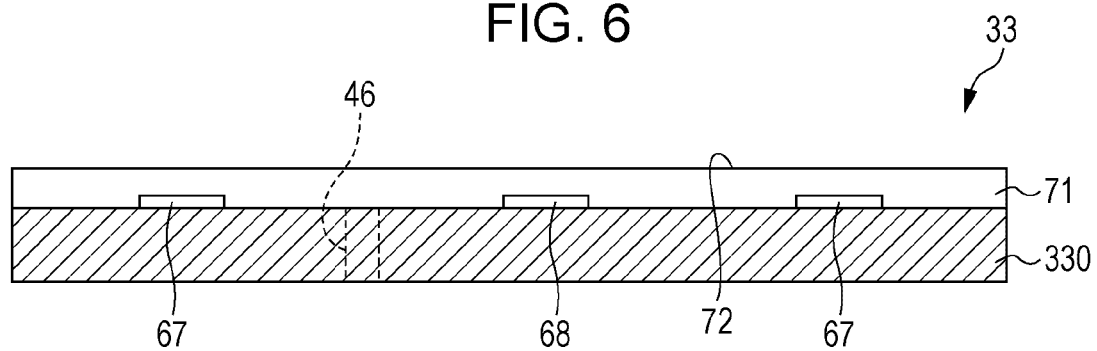
FIG. 6 is a schematic sectional diagram illustrating a state after finishing step S1.
Figure 7:
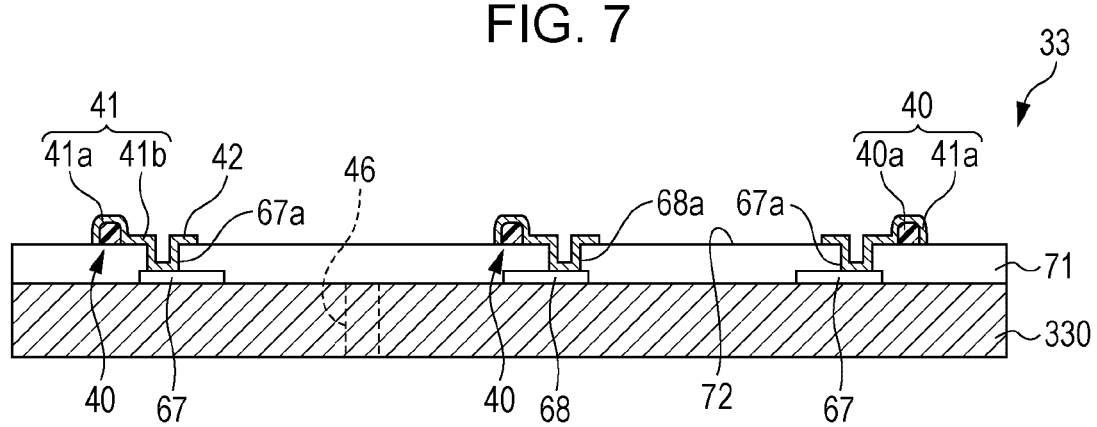
FIG. 7 is a schematic sectional diagram illustrating a state after finishing step S2.
Figure 8:
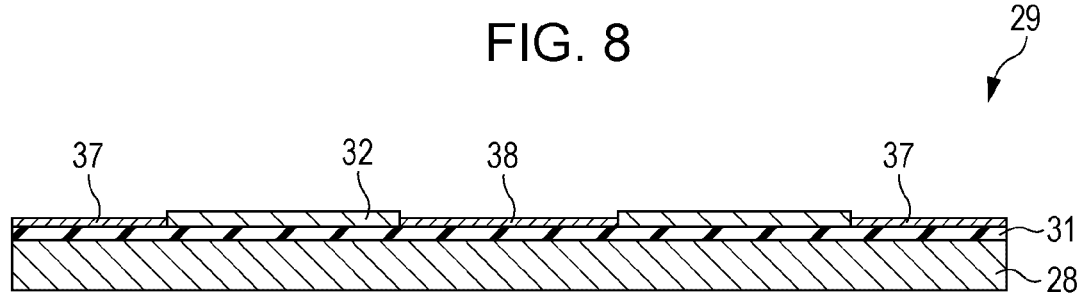
FIG. 8 is a schematic sectional diagram illustrating a state after finishing step S21.
Figure 9:
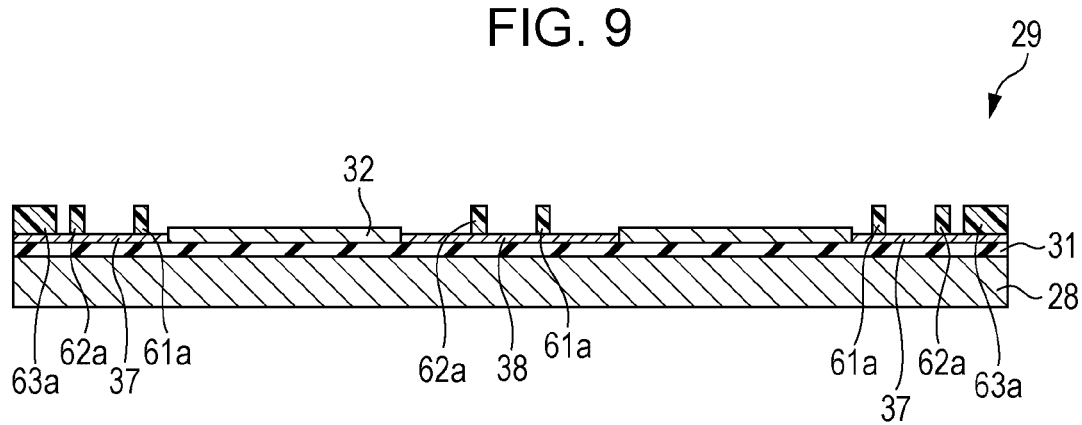
FIG. 9 is a schematic sectional diagram illustrating a state after finishing step S22.
Figure 10:
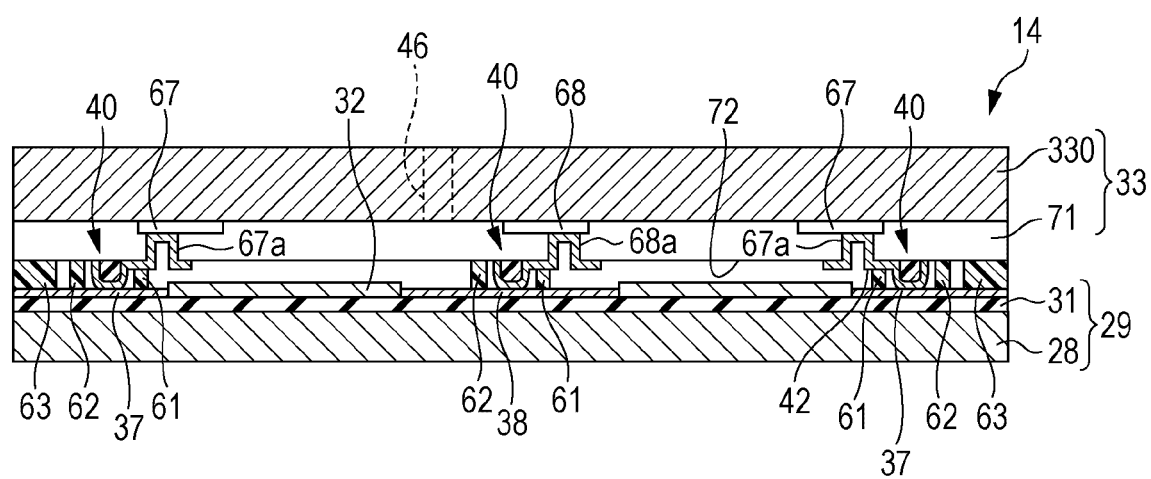
FIG. 10 is a schematic sectional diagram illustrating a state after finishing step S3.

FIG. 6 is a schematic sectional diagram illustrating a state after finishing step S1. FIG. 7 is a schematic sectional diagram illustrating a state after finishing step S2. FIG. 8 is a schematic sectional diagram illustrating a state after finishing step S21. FIG. 9 is a schematic sectional diagram illustrating a state after finishing step S22. FIG. 10 is a schematic sectional diagram illustrating a state after finishing step S3.

FIGS. 6 to 10 are diagrams corresponding to FIG. 2, FIGS. 6 and 7 illustrate the state of the first substrate 33, FIGS. 8 and 9 illustrate the state of the second substrate 29, and FIG. 10 illustrates the state of the electronic device 14.

The vertical direction in FIGS. 6 and 7 is inverted with respect to FIGS. 8 and 9. For example, in FIG. 7, the bump electrodes 40 are disposed on the top side of the base material 330 and in FIG. 10, the bump electrodes 40 are disposed on the bottom side of the base material 330, vertically inverting the dispositions of the bump electrodes 40 with respect to the base material 330 between FIG. 7 and FIG. 10. In FIGS. 6, 7 and 10, the depiction of constituent elements of the first substrate 33 which are not necessary for the description (the penetrating wirings 45, the power wirings 53, the individual connection terminals 54, and the like) is omitted.

In step S1, the through-hole 46 is formed at a predetermined position in the first substrate 33. For example, inductively coupled plasma is used to penetrate the base material 330 in the plate thickness direction. Regarding the processing by the inductively coupled plasma, it is possible to perform the processing without limitations to the hole size, the plate thickness, and the like in comparison to wet etching or the like.

The inner portion of the through-hole 46 may be covered by a moisture-resilient film or an alkaline liquid resilient film. For example, a configuration may be adopted in which a film of tungsten oxide (TaO) is formed using plasma CVD. The tungsten oxide (TaO) has excellent water resilience and alkaline resilience in comparison to silicon oxide.

In step S2, a photosensitive resin is applied is patterned using a photolithography process, an etching process, and the like, and a precursor resin is formed on the surface 72 of the protective layer 71. Next, the precursor resin is melted by a heating process to round the corners of the precursor resin and form the internal resin 40a on the surface 72 of the protective layer 71. Next, the openings 67a and 68a which expose the electrodes 67 and 68 are formed in the protective layer 71, a metal film which covers the surface 72 of the protective layer 71 and the openings 67a and 68a of the protective layer is formed using vapor deposition, sputtering, and the like, and the metal film is patterned using the photolithography process and the etching process to form the conductive film 41 (the conductive film 41a and the conductive film 41b) which covers the internal resin 40a and the openings 67a and 68a. Accordingly, as illustrated in FIG. 7, the bump electrodes 40 in which the internal resin 40a is covered by the conductive film 41a are formed. The bump electrodes 40 are electrically connected to the electrodes 67 and 68 by the conductive film 41b which covers the openings 67a and 68a.

In other words, in steps S2, the bump electrodes 40 which are electrically connected to the electrodes 67 and 68 are formed. The protective layer 71 includes a portion which is covered by the conductive film 41 and the flat surface 72 which is not covered by the conductive film 41. Since the conductive film 41b is formed to cover the flat surface of the protective layer 71, the conductive film 41b has the flat surface 42 which reflects the shape of the flat surface 72 of the protective layer 71.

In step S21, as illustrated in FIG. 8, the individual electrodes 37 and the common electrode 38 are formed by deposition, sputtering, and the like on the second substrate 29. The piezoelectric elements 32 are formed by sputtering, a sol-gel method, or the like.

In other words, in step S21, the individual electrodes 37, the common electrode 38, and the piezoelectric elements 32 are formed on the second substrate 29. Here, the individual electrodes 37, the common electrode 38, and the piezoelectric elements 32 are not configured to be protected against moisture by a film such as the protective layer 71.

In step S22, a liquid-state resin solution which has photosensitivity and heat curing properties is applied to the second substrate 29 on which the vibration plates 31 and the piezoelectric elements 32 are formed. Next, the liquid-state resin solution which is applied is pre-baked and a low fluidity resin film is formed. Since the liquid-state resin solution has high fluidity and favorably covers the unevenness of the second substrate 29, the low fluidity resin film also favorably covers the unevenness of the second substrate 29 and inconveniences such as gaps (vacancies) do not easily arise in the portions in which the unevenness is formed. Next, the resin film is patterned using the photolithography process, the result undergoes post-baking, and, as illustrated in FIG. 9, the low fluidity adhesives 61a, 62a, and 63a are formed on the second substrate 29.

In other words, in step S22, the low fluidity adhesives 61a, 62a, and 63a are formed by patterning the resin film which is formed by applying the resin solution which has photo-sensitivity and heat curing properties using the photolithography method. The low fluidity adhesives 61a, 62a, and 63a are in a state of not being completely cured and have elasticity and adhesive properties.

In step S22, in a case in which the adhesives 61, 62 and 63 are formed in step S3 (described later), the adhesives 61 and 62 are disposed so as not to interfere with the bump electrodes 40 and the adhesives 61a and 62a are disposed such that it is possible to form the first space.

In a case in which the adhesive 63 is formed in step S3 (described later), the adhesive 63a is disposed such that it is possible to form the second space.

Since the resin film is patterned using the photolithography method to form the low fluidity adhesives 61a, 62a, and 63a, it is possible to form the low fluidity adhesives 61a, 62a, and 63a with high precision at predetermined positions in comparison with, for example, a case in which the adhesives 61a, 62a, and 63a are formed using a dispensing method or a printing method. Therefore, it is also possible to form the adhesives 61, 62, and 63 which are formed by curing the low fluidity adhesives 61a, 62a, and 63a with high precision at predetermined positions.

The method of forming the low fluidity adhesives 61a, 62a, and 63a through patterning using the photolithography method has an excellent resolution in comparison to a method of forming the low fluidity adhesives 61a, 62a, and 63a using the dispensing method or the printing method, and it is possible to form a fine high-resolution (high density) pattern.

In step S3, the first substrate 33 which is formed by undergoing step S1 and step S2 and the second substrate 29 which is formed by undergoing step S21 and step S22 are stuck together, heat treatment is performed in a state in which the low fluidity adhesives 61a, 62a, and 63a abut and are pressed by the first substrate 33, the low fluidity adhesives 61a, 62a, and 63a are cured, and the adhesives 61, 62, and 63 which are bonded to both the first substrate 33 and the second substrate 29 are formed. In other words, the low fluidity adhesives 61a, 62a, and 63a are cured and the adhesives 61, 62, and 63 which bond the first substrate 33 and the second substrate 29 to each other are formed.

In step S3, as illustrated in FIG. 10, the adhesives 62 and 63 are bonded to the flat surface 72 of the protective layer 71 and the adhesive 61 is bonded to the flat surface 42 of the conductive film 41b and the flat surface 72 (refer to FIG. 7) of the protective layer 71. The protective layer 71 of the first substrate 33 and the second substrate 29 are bonded to each other by the adhesives 61, 62, and 63.

Next, the pressure generating chamber forming substrate 28 is subjected to anisotropic etching by KOH, for example, and the penetrating ports 30a which form the vacant portions of the pressure generating chambers 30 are formed. The end portion of the pressure generating chamber forming substrate 28 is etched at the same time and the pressure generating chamber forming substrate 28 is rendered smaller than the first substrate 33 (the base material 330). The drive IC 34 is bonded to the surface of the first substrate 33 on the opposite side from the second substrate 29 side via the adhesive 59 to manufacture the electronic device 14. The electronic device 14, the flow path unit 15, and the head case 16 are bonded to each other to manufacture the recording head 3.

Step S1 is an example of "a process of forming a through-hole in the first substrate". Step S2 is an example of "a process of forming a third electrode and a first electrode on the first substrate". Step S21 is an example of "a process of forming a second electrode and a piezoelectric element on the second substrate". Step S22 is an example of "a process of applying a photosensitive adhesive to the second substrate and performing patterning using the photolithography method". Step S3 is an example of "a process of curing the adhesive".

As described above, according to the MEMS device, the liquid ejecting head, the liquid ejecting apparatus, and the manufacturing method of the MEMS device according to the present embodiment, it is possible to obtain the following effects.

It is possible to provide a more reliable MEMS device in which the electrodes 67 and 68 (the first electrode), the individual electrodes 37 and the common electrode 38 (the second electrode), the bump electrodes 40 (the third electrode), and the piezoelectric elements 32 are surrounded by the adhesives 61, 62, and 63 and degradation of the electrodes caused by the entrance of moisture (humidity) from the through-hole 46 which is formed in the first substrate 33 or the second substrate 29 and is open to the atmosphere is suppressed.

The second space is configured to not include any of the electrodes 67 and 68 (the first electrode), the individual electrodes 37 and the common electrode 38 (the second electrode), the bump electrodes 40 (the third electrode), or the piezoelectric elements 32 and to include the through-hole 46 which penetrates at least one of the first substrate and the second substrate and communicates with the atmosphere. In other words, the first substrate 33 and the second substrate 29 are bonded to each other such that the space which is open to the atmosphere is contained between the first substrate 33 and the second substrate 29.

In this manner, by disposing the second space separately from the first space, even if the gas inside the second space expands, since the through-hole 46 is present and the second space communicates with the atmosphere, it is possible to reduce the pressure rising of the second space and it is possible to reduce the force which resists the adhering force of the adhesives 61, 62, and 63 and to reduce the positional deviation between the first substrate 33 and the second substrate 29. Since the second space is configured as a space which does not include any of the electrodes 67 and 68 (the first electrode), the individual electrodes 37 and the common electrode 38 (the second electrode), the bump electrodes 40 (the third electrode), or the piezoelectric elements 32, even if the second space is caused to communicate with the atmosphere, there is no concern of a drop in reliability and it is possible to provide a more reliable MEMS device.

For the liquid ejecting head (the recording head 3), the second substrate 29 is provided with the piezoelectric elements 32 which are electrically connected to the individual electrodes 37 and the common electrode 38 (the second electrode). The piezoelectric elements 32 which are provided on the second substrate 29 are electrically connected, in a stable manner, to the electrodes 67 and 68 (the first electrode) of the first substrate 33 via the individual electrodes 37, the common electrode 38 (the second electrode), and the bump electrodes 40 (the third electrode). Therefore, it is possible to provide a liquid ejecting head in which the drive signals are stably supplied to the piezoelectric elements 32 from the first substrate 33 side and the piezoelectric elements 32 operate stably. In this manner, the liquid ejecting head operates stably and has high reliability. Therefore, the liquid ejecting apparatus (the printer 1) which is provided with the liquid ejecting head (the recording head 3) also operates stably and has high reliability.

In the manufacturing method of the recording head 3 according to the present embodiment, by disposing the first space which includes the electrodes 67 and 68 (the first electrode), the individual electrodes 37 and the common electrode 38 (the second electrode), the bump electrodes 40 (the third electrode), and the piezoelectric elements 32 in the space between the first substrate 33 and the second substrate 29 separately from the second space, even if the gas inside the second space expands, since the through-hole 46 is present and the second space communicates with the atmosphere, it is possible to reduce the pressure rising and it is possible to reduce the force which resists the adhering force of the adhesives 61, 62, and 63 and to reduce the positional deviation between the first substrate 33 and the second substrate 29, and so it is possible to suppress failures of the recording head 3 and to further improve the reliability of the recording head 3.

In the manufacturing method of the recording head 3 according to the present embodiment, due to the first space and the second space being configured in the space between the first substrate 33 and the second substrate 29, degradation of the electrodes caused by the entrance of moisture (humidity) from the through-hole 46 is suppressed and it is possible to suppress failures of the recording head 3 and to further improve the reliability of the recording head 3.

Second Embodiment

Figure 11:
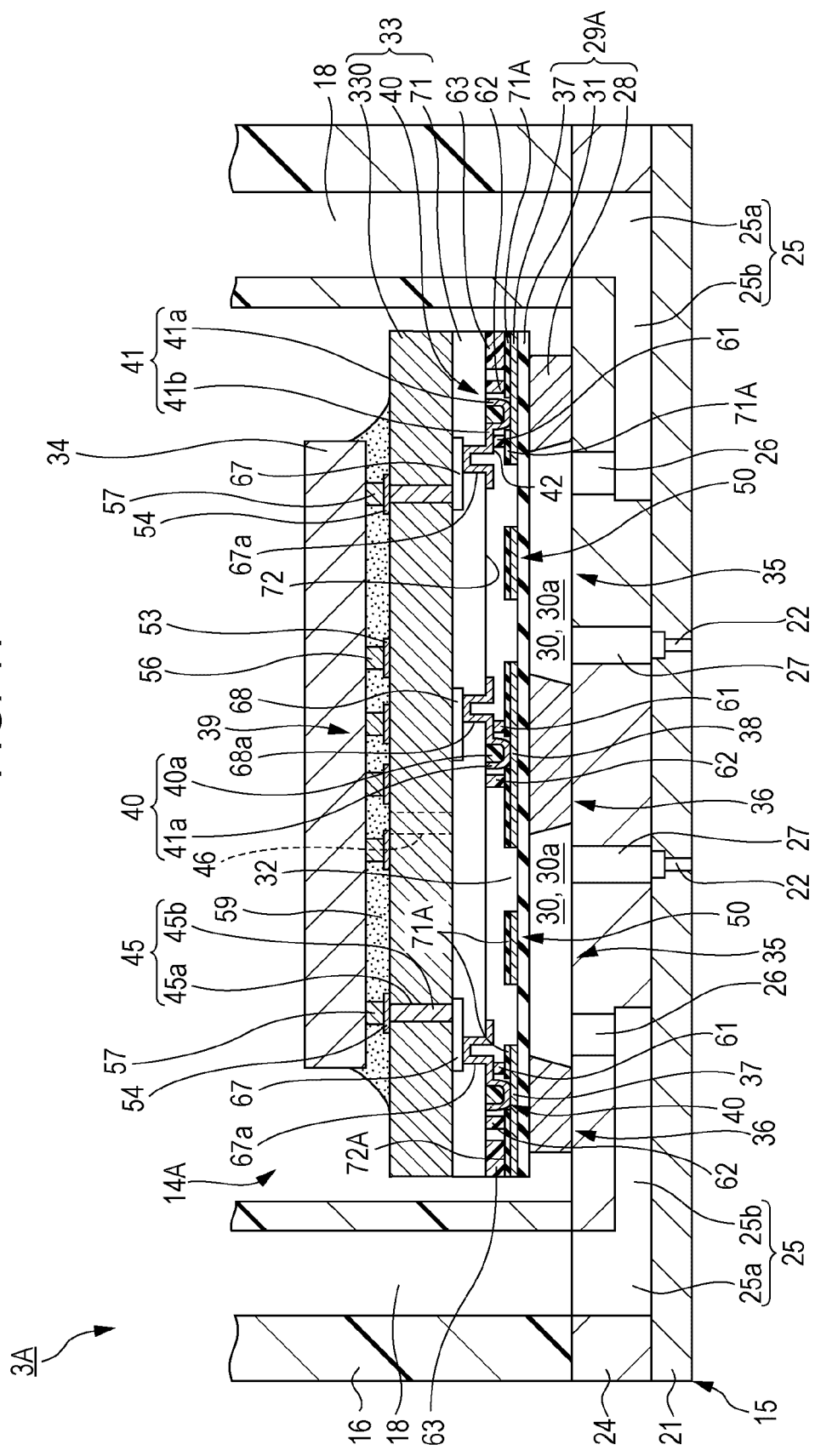
FIG. 11 is a schematic sectional diagram illustrating the configuration of a liquid ejecting head (a recording head) according to a second embodiment.

FIG. 11 is a diagram corresponding to FIG. 2 and is a schematic sectional diagram illustrating the configuration of a liquid ejecting head (a recording head 3A) according to the second embodiment.

In the recording head 3 according to the first embodiment, a description is given of an example of a configuration in which the electrodes 67 and 68 (the first electrode), the individual electrodes 37 and the common electrode 38 (the second electrode), the bump electrodes 40 (the third electrode), and the piezoelectric elements 32 are contained in the first space. However, in the present embodiment (the second embodiment), a description is given of an example in which "the wirings" which connect the electrodes 67 and 68 (the first electrode), the individual electrodes 37 and the common electrode 38 (the second electrode), the bump electrodes 40 (the third electrode), the piezoelectric elements 32 and the like are disposed in the second space for the electrical connection.

In the recording head 3A according to the present embodiment, in a second substrate 29A, a protective layer 71A is formed on "the wirings" which are disposed in the second space which does not surround the adhesives 61 and 62 and which communicates with the atmosphere. This point is a difference between the recording head 3A according to the present embodiment and the recording head 3 according to the first embodiment and the other configurations are the same between the present embodiment and the first embodiment.

Hereinafter, a description will be given of the outline of the recording head 3A according to the present embodiment centered on the differences from the first embodiment with reference to FIG. 11. Components which are the same as those in the first embodiment will be given the same reference numerals and duplicate descriptions will be omitted.

As illustrated in FIG. 11, the recording head 3A includes the flow path unit 15, an electronic device 14A, and the head case 16.

The electronic device 14A is a thin plate-shaped MEMS device which functions as an actuator which generates a pressure change in the ink inside each of the pressure generating chambers 30. In other words, in the electronic device 14A, a pressure change is generated in the ink inside each of the pressure generating chambers 30 and the ink is ejected from the nozzles 22 which communicate with each of the pressure generating chambers 30. The electronic device 14A has a configuration in which the second substrate 29A, the adhesives 61, 62, and 63, and the first substrate 33 are laminated in order to form a unit.

The first substrate 33 is disposed to be laminated on the second substrate 29A and includes the base material 330 on which drive circuits 39 which drive the piezoelectric elements 32 (not illustrated in FIG. 11) are formed, electrodes (the electrodes 67, the electrodes 68, and the bump electrodes 40) for supplying the signals from the drive circuits 39 to the second substrate 29, and the like.

The second substrate 29A is disposed to be laminated on the first substrate 33 and includes the pressure generating chamber forming substrate 28, the vibration plates 31, the piezoelectric elements 32, the individual electrodes 37, and the common electrode 38.

As illustrated in FIG. 11, in the second substrate 29A, wirings 50 are disposed in the second space which communicates with the atmosphere. The wirings 50 are wirings which are electrically connected to at least one of the electrodes 67 and 68 (the first electrode), the individual electrodes 37 and the common electrode 38 (the second electrode), the bump electrodes 40 (the third electrode), and the piezoelectric elements 32.

The adhesives 61, 62, and 63 are bonded between the first substrate 33 and the second substrate 29A. In other words, the first substrate 33 and the second substrate 29A are bonded to each other by the adhesives 61, 62, and 63.

The protective layer 71A is formed in the lamination direction on the individual wirings in the second space (the wirings between the portions which configure the piezoelectric elements 32 and the portions which form the individual electrodes 37 (refer to FIG. 2)), the common wiring (the wiring between the portions which configure the piezoelectric elements 32 and the portion which forms the common electrode 38 (refer to FIG. 2)), the wirings 50, and the like. In other words, the individual wirings, the common wiring, the wirings 50, and the like of the second space are covered by the protective layer 71A.

The individual wirings and the common wiring which are disposed in the second space include the wirings 50 and correspond to "the wiring" in the invention.

The plurality of adhering regions which are adhered by the adhesives 61, 62, and 63 are configured to adhere the first substrate 33 and the second substrate 29A to each other by interposing the protective layer 71A therebetween. In other words, the protective layer 71A is bonded between the adhesives 61, 62, and 63 which are formed on the first substrate 33 and the second substrate 29A.

Hypothetically, in a case in which a bonding surface 72A to which the adhesives 61, 62, and 63 are bonded includes an uneven portion caused by the presence and absence of the protective layer 71A, a portion which adheres the first substrate 33 and the second substrate 29A to each other by interposing the protective layer 71A therebetween, and a portion which adheres the first substrate 33 and the second substrate 29A to each other without interposing the protective layer 71A, and the bonding between the first substrate 33 and the second substrate 29A is inclined, gaps (vacancies) may be formed between the layers of the adhesives 61, 62, and 63 and the protective layer 71A. As a result, there is a concern of moisture (humidity) entering from the gaps, the electrodes 67 and 68 (the first electrode), the individual electrodes 37 and the common electrode 38 (the second electrode), and the bump electrodes 40 (the third electrode) which are configured in the inner portion of the first space being degraded by the moisture, and the reliability of the electrodes 67 and 68 (the first electrode), the individual electrodes 37 and the common electrode 38 (the second electrode), and the bump electrodes 40 (the third electrode) declining.

When the bonding reliability between the adhesives 61, 62, and 63 and the bonding surface of the first substrate 33 is low, faults such as peeling and cracking occur in the portions at which the adhesive 63 and the bonding surface of the first substrate 33 are bonded, and in a case in which anisotropic etching is carried out using KOH as described above, the etchant may seep in from the faults and the inconvenience of the electrodes 67 and 68 (the first electrode), the individual electrodes 37 and the common electrode 38 (the second electrode), and the bump electrodes 40 (the third electrode) being degraded may occur.

When the bonding reliability between the adhesives 61, 62, and 63 and the bonding surface of the first substrate 33 is low, faults such as peeling and cracking are more likely to occur in the portions at which the adhesives 61, 62, and 63 and the bonding surface of the first substrate 33 are bonded due to mechanical shock, the recording head 3A is degraded, and the reliability of the recording head 3A may be reduced.

For example, a silicon oxide (the protective layer 71A) which covers the individual electrodes 37 and the common electrode 38 (the second electrode), the bump electrodes 40 (the third electrode), and the piezoelectric elements 32 is formed using plasma CVD which uses tetraethoxysilane (TEOS), for example. The silicon oxide which is formed using plasma CVD which uses TEOS has excellent gradation-covering properties and is capable of favorably covering the unevenness of the individual electrodes 37 and the common electrode 38 (the second electrode), the bump electrodes 40 (the third electrode), and the like.

The protective layer 71A may be a multi-layered film including a silicon oxide and a silicon nitride. For example, a configuration may be adopted in which after forming a film of the silicon oxide using the plasma CVD which uses TEOS, a film of the silicon nitride which is thicker than the silicon oxide is formed using the plasma CVD, and the silicon nitride is subjected to planarization using CMP. For example, a configuration may be adopted in which the silicon nitride is formed using the plasma CVD on the silicon oxide which is subjected to planarization using CMP.

The silicon nitride has excellent water resilience in comparison to the silicon oxide. It is possible to increase the water resilience of the protective layer 71A by configuring the protective layer 71A using a multi-layered film including the silicon oxide and the silicon nitride.

As described above, according to the MEMS device and the liquid ejecting head according to the present embodiment, it is possible to obtain the following effects.

It is possible to provide a more reliable MEMS device in which degradation caused by the entrance of moisture (humidity) from the through-hole 46 which is formed in the first substrate 33 or the second substrate 29A is suppressed by covering the individual wirings, the common wiring, the wirings 50, and the like which are contained in the second space which communicates with the atmosphere with the protective layer 71A.

In comparison to a case in which the bonding between the first substrate 33 and the second substrate 29A is inclined, the gaps (vacancies) are not easily formed between the adhesives 61, 62, and 63 and the bonding surface of the protective layer 71A and the liquid ejecting head (the recording head 3A) is capable of suppressing the entrance of moisture (humidity).

In the recording head 3A, since the bonding reliability between the adhesives 61, 62, and 63 and the bonding surface of the first substrate 33 is higher, in comparison to a case in which the bonding reliability between the adhesives 61, 62, and 63 and the bonding surface of the first substrate 33 is low, faults such as peeling and cracking are more likely to occur in the portions at which the adhesives 61, 62, and 63 and the bonding surface of the first substrate 33 are bonded, degradation of the recording head 3A is suppressed, and it is possible to further increase the reliability of the recording head 3A.

Third Embodiment

Figure 12:
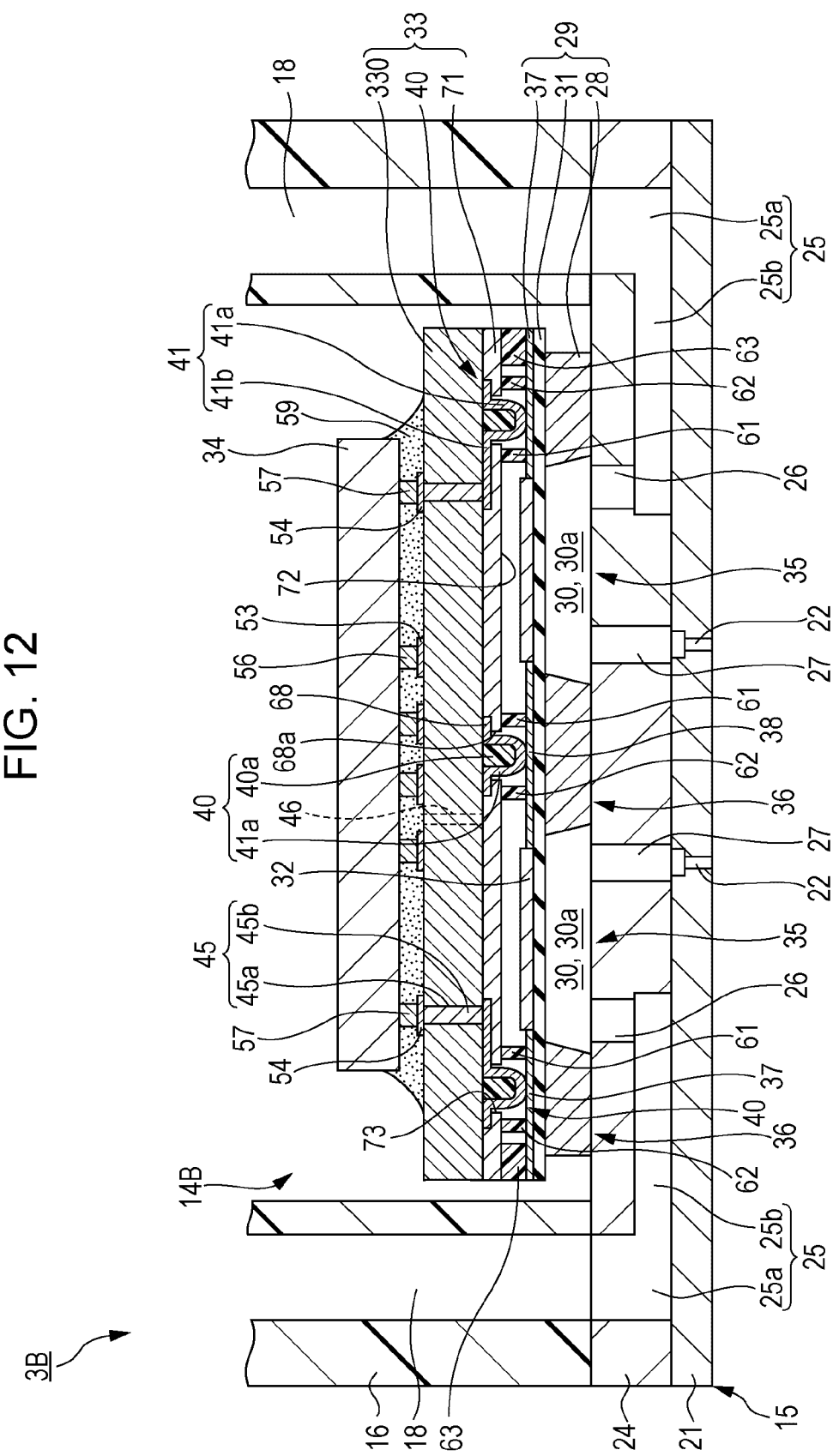
FIG. 12 is a schematic sectional diagram illustrating the configuration of a liquid ejecting head (a recording head) according to a third embodiment.

FIG. 12 is a diagram corresponding to FIG. 2 and is a schematic sectional diagram illustrating the configuration of a liquid ejecting head (a recording head 3B) according to the third embodiment. Members which are the same as those in the embodiment described above are assigned identical reference signs and numerals and a repeated description will be omitted.

As illustrated in FIG. 12, the recording head 3B includes the flow path unit 15, an electronic device 14B, and the head case 16.

The electronic device 14B has a configuration in which the second substrate 29, the adhesives 61, 62, and 63, the first substrate 33, and the drive IC 34 are laminated in order to form a unit.

The first substrate 33 includes the base material 330 which is formed of a silicon single crystal substrate, the bump electrodes 40 which are provided on the base material 330, and the protective layer 71 which covers the main portions on the bump electrode 40 side of the base material 330.

The bump electrodes 40 are provided directly on the surface on the second substrate 29 side of the base material 330. The bump electrodes 40 include the elastic internal resin 40a and the conductive film 41 which covers the internal resin 40a. The bump electrodes 40 are provided at positions corresponding to each of the individual electrodes 37 and the common electrode 38 of the second substrate 29. The conductive film 41 includes a portion (hereinafter, the conductive film 41a) which covers the internal resin 40a and a portion (hereinafter, the conductive film 41b) which is formed on the surface of the base material 330. The conductive film 41b which configures the bump electrodes 40 is provided to extend to a position covering the openings of the through-holes 45a, and the conductive film 41b and the conducting portions 45b which fill the insides of the through-holes 45a are directly connected to each other. In other words, in the present embodiment, the conductive film 41 of the bump electrodes 40 also functions as the electrodes 67 and 68 of the first and second embodiments. In other words, the conductive film 41 is an example of "a first electrode". Naturally, similar electrodes 67 and 68 to those of the first and second embodiments may be provided on the base material 330 separately from the conductive film 41 of the bump electrodes 40.

The protective layer 71 is provided on the surface of the second substrate 29 side of the base material 330 and is provided to cover a portion of the conductive film 41b of the bump electrodes 40 which are provided on the second substrate 29. Connecting holes 73 which penetrate the protective layer 71 in the vertical direction are provided in the protective layer 71 at the positions at which the bump electrodes 40 are provided. The internal resin 40a of the bump electrodes 40 and the conductive film 41a which is provided on the surface of the internal resin 40a are inserted into the connecting holes 73 of the protective layer 71. The leading ends of the bump electrodes 40 which are inserted through the connecting holes 73 are provided to protrude further to the second substrate 29 side than the surface 72 of the protective layer 71, and the leading ends of the bump electrodes 40 which protrude are connected to each of the individual electrodes 37 and the common electrode 38 of the second substrate 29. In other words, the protective layer 71 is provided continuously along the region other than the conductive film 41a of the bump electrodes 40 on the surface on the second substrate 29 side of the base material 330 at a lesser thickness than the height by which the protective layer 71 protrudes to the second substrate 29 side from the base material 330 of the bump electrodes 40.

The first substrate 33 and the second substrate 29 are bonded to each other by the adhesives 61, 62, and 63. In the present embodiment, protective layer 71 of the first substrate 33 and the second substrate 29 are bonded to each other by the adhesives 61, 62, and 63.

As described above, according to the MEMS device and the liquid ejecting head according to the present embodiment, it is possible to obtain the following effects.

It is possible to provide a more reliable MEMS device in which the conductive film 41 (the first electrode), the individual electrodes 37 and the common electrode 38 (the second electrode), the bump electrodes 40 (the third electrode), and the piezoelectric elements 32 are surrounded by the adhesives 61, 62, and 63 and degradation of the electrodes caused by the entrance of moisture (humidity) from the through-hole 46 which is formed in the first substrate 33 or the second substrate 29 and is open to the atmosphere is suppressed.

The second space is configured to not include any of the conductive film 41 (the first electrode), the individual electrodes 37 and the common electrode 38 (the second electrode), the bump electrodes 40 (the third electrode), or the piezoelectric elements 32 and to include the through-hole 46 which penetrates at least one of the first substrate 33 and the second substrate 29 and communicates with the atmosphere. In other words, the first substrate 33 and the second substrate 29 are bonded to each other such that the space which is open to the atmosphere is contained between the first substrate 33 and the second substrate 29.

In this manner, by disposing the second space separately from the first space, even if the gas inside the second space expands, since the through-hole 46 is present and the second space communicates with the atmosphere, it is possible to reduce the pressure rising of the second space and it is possible to reduce the force which resists the adhering force of the adhesives 61, 62, and 63 and to reduce the positional deviation between the first substrate 33 and the second substrate 29. Since the second space is configured as a space which does not include any of the electrodes 67 and 68 (the first electrode), the individual electrodes 37 and the common electrode 38 (the second electrode), the bump electrodes 40 (the third electrode), or the piezoelectric elements 32, even if the second space is caused to communicate with the atmosphere, there is no concern of a drop in reliability and it is possible to provide a more reliable MEMS device.

For the liquid ejecting head (the recording head 3B), the second substrate 29 is provided with the piezoelectric elements 32 which are electrically connected to the individual electrodes 37 and the common electrode 38 (the second electrode). The piezoelectric elements 32 which are provided on the second substrate 29 are electrically connected, in a stable manner, to the first electrode (for example, the conductive film 41) of the first substrate 33 via the individual electrodes 37, the common electrode 38 (the second electrode), and the bump electrodes 40 (the third electrode). Therefore, it is possible to provide a liquid ejecting head in which the drive signals are stably supplied to the piezoelectric elements 32 from the first substrate 33 side and the piezoelectric elements 32 operate stably. In this manner, the liquid ejecting head (the recording head 3B) operates stably and has high reliability. Therefore, the liquid ejecting apparatus (the printer 1) which is provided with the liquid ejecting head (the recording head 3B) also operates stably and has higher reliability.

In the present embodiment, although the protective layer 71 is provided continuously along the region other than the conductive film 41a of the bump electrodes 40 on the surface on the second substrate 29 side of the base material 330, the configuration is not particularly limited thereto, and the protective layer 71 may not be provided in regions other than above the conductive film 41b on the base material 330 of the bump electrodes 40.

In the present embodiment, although the protective layer 71 is provided both on the conductive film 41b of the bump electrodes 40 which are connected to the individual electrodes 37 and on the conductive film 41b of the bump electrode 40 which is connected to the common electrode 38, the configuration is not particularly limited thereto, and the protective layer 71 may be provided to cover only one of either the conductive film 41b of the bump electrodes 40 which are connected to the individual electrodes 37 or the conductive film 41b of the bump electrode 40 which is connected to the common electrode 38. In this manner, a configuration in which the protective layer 71 is provided on only a portion of the conductive film 41b of the plurality of bump electrodes 40 may be realized by a configuration in which the bump electrodes 40 are directly formed on the base material 330, as in the present embodiment. In other words, this is because, in the present embodiment, since the bump electrodes 40 are directly formed on the base material 330, even if the protective layer 71 is provided partially on the conductive film 41b, variation in the heights of the plurality of bump electrodes 40 caused by the presence or absence of the protective layer 71 does not occur, and it is possible to connect the plurality of bump electrodes 40 to the individual electrodes 37 and the common electrode 38 at the same height.

The invention widely targets liquid ejecting heads in general. For example, it is possible to apply the invention to recording heads such as various ink jet recording heads which are used in an image recording apparatus such as a printer, color material ejecting heads which are used in the manufacture of color filters of liquid crystal displays and the like, electrode material ejecting heads which are used in the electrode formation of organic EL displays, field emission displays (FED) and the like, bio-organic matter ejecting heads which are used in the manufacture of biochips, and the like, and these fall within the technical scope of the invention.

The invention widely targets MEMS devices and it is also possible to apply the invention to MEMS devices other than the recording heads 3 and 3A which are described above. For example, SAW devices (surface acoustic wave devices), ultrasonic wave devices, motors, pressure sensors, pyroelectric elements, and ferroelectric elements are examples of MEMS devices, it is possible to apply the invention thereto, and these fall within the technical scope of the invention.

It is also possible to apply the invention to completed objects using these MEMS devices, for example, a liquid ejecting apparatus which uses the recording head 3 or 3A which is described above, a SAW oscillator which uses the SAW device, an ultrasonic wave sensor which uses the ultrasonic wave device, a robot which uses the motor as a drive source, an IR sensor which uses the pyroelectric element, a ferroelectric memory which uses the ferroelectric element, and the like, and these fall within the technical scope of the invention.

What is claimed is:

1. A MEMS device comprising:
a first substrate which includes a first electrode;
a second substrate which includes a second electrode and on which the first electrode and the second electrode are disposed by being laminated between the second substrate and the first substrate;
a third electrode which is disposed between the first substrate and the second substrate and which electrically connects the first electrode and the second electrode to each other;
a piezoelectric element which is disposed between the first substrate and the second substrate; and
an adhesive which adheres the first substrate and the second substrate to each other,
wherein a first space which includes the first electrode, the second electrode, the third electrode, and the piezoelectric element and which is configured as a closed space which is isolated from an atmosphere by the first substrate, the second substrate, and the adhesive is disposed in a space between the first substrate and the second substrate, and
wherein a second space which does not include any of the first electrode, the second electrode, the third electrode, or the piezoelectric element and which communicates with the atmosphere due to a through-hole which penetrates at least one of the first substrate and the second substrate is disposed in the space between the first substrate and the second substrate.

2. The MEMS device according to claim 1, further comprising:
a wiring which is electrically connected to at least one of the first electrode, the second electrode, the third electrode, and the piezoelectric element,
wherein the wiring which is contained in the second space is isolated from the atmosphere by a protective layer which covers the wiring.

3. The MEMS device according to claim 2,
wherein a plurality of adhering regions which are adhered by the adhesive adhere the first substrate and the second substrate to each other, by interposing the protective layer therebetween.

4. A liquid ejecting head comprising:
the MEMS device according to claim 3.

5. A liquid ejecting head comprising:
the MEMS device according to claim 2.

6. A liquid ejecting head comprising:
the MEMS device according to claim 1.

7. A liquid ejecting apparatus comprising:
the liquid ejecting head according to claim 6.

* * * * *